US011232849B2

(12) United States Patent
Wieduwilt

(10) Patent No.: US 11,232,849 B2
(45) Date of Patent: Jan. 25, 2022

(54) MEMORY DEVICE WITH A REPAIR MATCH MECHANISM AND METHODS FOR OPERATING THE SAME

(71) Applicant: Micron Technology, Inc., Boise, ID (US)

(72) Inventor: Christopher G. Wieduwilt, Boise, ID (US)

(73) Assignee: Micron Technology, Inc., Boise, ID (US)

(*) Notice: Subject to any disclaimer, the term of this patent is extended or adjusted under 35 U.S.C. 154(b) by 49 days.

(21) Appl. No.: 16/701,671

(22) Filed: Dec. 3, 2019

(65) Prior Publication Data

US 2021/0166776 A1 Jun. 3, 2021

(51) Int. Cl.
*G11C 29/44* (2006.01)
*G11C 29/42* (2006.01)
*G11C 29/02* (2006.01)
*G11C 29/00* (2006.01)

(52) U.S. Cl.
CPC ........... *G11C 29/44* (2013.01); *G11C 29/027* (2013.01); *G11C 29/42* (2013.01); *G11C 29/76* (2013.01); *G11C 29/789* (2013.01)

(58) Field of Classification Search
CPC ....... G11C 29/44; G11C 29/027; G11C 29/42; G11C 29/76; G11C 29/789
USPC ...................................................... 365/185
See application file for complete search history.

(56) References Cited

U.S. PATENT DOCUMENTS

| 5,706,292 | A | * | 1/1998 | Merritt | G11C 29/70 |
| | | | | | 714/710 |
| 5,774,471 | A | * | 6/1998 | Jiang | G11C 29/808 |
| | | | | | 714/711 |
| 6,084,807 | A | * | 7/2000 | Choi | G11C 29/83 |
| | | | | | 365/200 |
| 7,196,952 | B1 | * | 3/2007 | Trinh | G11C 29/78 |
| | | | | | 365/200 |
| 7,237,154 | B1 | * | 6/2007 | Zorian | G11C 29/56008 |
| | | | | | 714/711 |
| 2007/0058462 | A1 | | 3/2007 | Blodgett | |
| 2007/0255982 | A1 | * | 11/2007 | Adsitt | G11C 29/56 |
| | | | | | 714/718 |
| 2009/0187798 | A1 | * | 7/2009 | Kim | G11C 8/14 |
| | | | | | 714/710 |
| 2014/0082453 | A1 | * | 3/2014 | Sikdar | G11C 29/44 |
| | | | | | 714/763 |
| 2014/0157087 | A1 | * | 6/2014 | Yurzola | G11C 29/52 |
| | | | | | 714/773 |
| 2017/0062067 | A1 | * | 3/2017 | Yang | G11C 16/10 |

* cited by examiner

*Primary Examiner* — Sung Il Cho
(74) *Attorney, Agent, or Firm* — Perkins Coie LLP

(57) ABSTRACT

Methods, apparatuses and systems related to managing access to a memory device are described. A memory device includes fuses and latches for storing a repair address and a plane locator. A match circuit generates a repair enable flag based on the plane locator, wherein the repair status represents enable, disable, and/or unused setting for the repair address with respect to implementing a global replace for the repair address with redundant cells on a repair plane.

23 Claims, 10 Drawing Sheets

| EN (post-XOR)* | CP4 | CP3 | CP2 | CP1 | CP0 | CA0-5 | Decode |
|---|---|---|---|---|---|---|---|
| 0 | X | X | X | X | X | X | Unused Repair OR Disabled Repair |
| 1 | 0 | 0 | 0 | 0 | 0 | X | Repair CP0 |
| 1 | 0 | 0 | 0 | 0 | 1 | X | Repair CP1 |
| 1 | 0 | 0 | 0 | 1 | 0 | X | Repair CP2 |
| 1 | 0 | 0 | 0 | 1 | 1 | X | Repair CP3 |
| 1 | 0 | 0 | 1 | 0 | 0 | X | Repair CP4 |
| 1 | 0 | 0 | 1 | 0 | 1 | X | Repair CP5 |
| 1 | 0 | 0 | 1 | 1 | 0 | X | Repair CP6 |
| 1 | 0 | 0 | 1 | 1 | 1 | X | Repair CP7 |
| 1 | 0 | 1 | 0 | 0 | 0 | X | Repair CP8 |
| 1 | 0 | 1 | 0 | 0 | 1 | X | Repair CP9 |
| 1 | 0 | 1 | 0 | 1 | 0 | X | Repair CP10 |
| 1 | 0 | 1 | 0 | 1 | 1 | X | Repair CP11 |
| 1 | 0 | 1 | 1 | 0 | 0 | X | Repair CP12 |
| 1 | 0 | 1 | 1 | 0 | 1 | X | Repair CP13 |
| 1 | 0 | 1 | 1 | 1 | 0 | X | Repair CP14 |
| 1 | 0 | 1 | 1 | 1 | 1 | X | Repair CP15 |
| 1 | 1 | 0 | 0 | 0 | 0 | X | Repair CPECC |
| 1 | 1 | 0 | 0 | 0 | 1 | X | Undefined |
| 1 | 1 | 0 | 0 | 1 | 0 | X | Undefined |
| 1 | 1 | 0 | 0 | 1 | 1 | X | Undefined |
| 1 | 1 | 0 | 1 | 0 | 0 | X | Undefined |
| 1 | 1 | 0 | 1 | 0 | 1 | X | Undefined |
| 1 | 1 | 0 | 1 | 1 | 0 | X | Undefined |
| 1 | 1 | 0 | 1 | 1 | 1 | X | Undefined |
| 1 | 1 | 1 | 0 | 0 | 0 | X | Undefined |
| 1 | 1 | 1 | 0 | 0 | 1 | X | Undefined |
| 1 | 1 | 1 | 0 | 1 | 0 | X | Undefined |
| 1 | 1 | 1 | 0 | 1 | 1 | X | Undefined |
| 1 | 1 | 1 | 1 | 0 | 0 | X | Undefined |
| 1 | 1 | 1 | 1 | 0 | 1 | X | Undefined |
| 1 | 1 | 1 | 1 | 1 | 0 | X | Undefined |
| 1 | 1 | 1 | 1 | 1 | 1 | X | Undefined |

*XOR of EN fuse and CA4 fuse

*FIG. 4B*

| CP4 | CP3 | CP2 | CP1 | CP0 | CA0-5 | Decode |
|---|---|---|---|---|---|---|
| 0 | 0 | X | X | X | X | Unused Repair |
| 1 | 0 | 0 | 0 | 0 | X | Repair CP0 |
| 1 | 0 | 0 | 0 | 1 | X | Repair CP1 |
| 1 | 0 | 0 | 1 | 0 | X | Repair CP2 |
| 1 | 0 | 0 | 1 | 1 | X | Repair CP3 |
| 1 | 0 | 1 | 0 | 0 | X | Repair CP4 |
| 1 | 0 | 1 | 0 | 1 | X | Repair CP5 |
| 1 | 0 | 1 | 1 | 0 | X | Repair CP6 |
| 1 | 0 | 1 | 1 | 1 | X | Repair CP7 |
| 0 | 1 | 0 | 0 | 0 | X | Repair CP8 |
| 0 | 1 | 0 | 0 | 1 | X | Repair CP9 |
| 0 | 1 | 0 | 1 | 0 | X | Repair CP10 |
| 0 | 1 | 0 | 1 | 1 | X | Repair CP11 |
| 0 | 1 | 1 | 0 | 0 | X | Repair CP12 |
| 0 | 1 | 1 | 0 | 1 | X | Repair CP13 |
| 0 | 1 | 1 | 1 | 0 | X | Repair CP14 |
| 0 | 1 | 1 | 1 | 1 | X | Repair CP15 |
| 1 | 1 | 0 | 0 | 1 | X | Repair CPECC |
| 1 | 1 | 0 | 0 | 0 | X | Undefined |
| 1 | 1 | 0 | 1 | 0 | X | Undefined |
| 1 | 1 | 0 | 1 | 1 | X | Undefined |
| 1 | 1 | 1 | X | X | X | Disabled Repair |

*FIG. 5B*

MEMORY DEVICE WITH A REPAIR MATCH MECHANISM AND METHODS FOR OPERATING THE SAME

TECHNICAL FIELD

The disclosed embodiments relate to devices, and, in particular, to semiconductor memory devices with a memory repair match mechanism and methods for operating the same.

BACKGROUND

Memory devices can include semiconductor circuits configured to utilize electrical energy to store and access information. Some examples of the memory devices include a volatile memory device, such as dynamic random-access memory (DRAM), a non-volatile memory device, or a combination device.

The memory devices often include defects that prevent the electrical energy/information to be properly stored and/or accessed. As such, some memory devices include redundant storage circuits (i.e., redundant memory cells) that are configured to replace the defective storage circuits. Since the number and location of the defects are unpredictable, the memory devices are typically designed for worst-case scenarios. In other words, the memory devices often include more redundant storage circuits than actual defects, thereby leaving several redundant storage circuits unused.

BRIEF DESCRIPTION OF THE DRAWINGS

FIG. 4B is a first example decode mechanism in accordance with an embodiment of the present technology.

FIG. 5B is a second example decode mechanism in accordance with an embodiment of the present technology.

DETAILED DESCRIPTION

As described in greater detail below, the technology disclosed herein relates to an apparatus, such as a memory device, a memory system, a system with one or more memory devices, and methods for repairing memory cells therein. The apparatus includes a match circuit that facilitates repairs using redundant memory cells. For example, the match circuit can implement global column repair schemes for an apparatus having a number of planes (e.g., column planes) that is not a power of two (e.g., 2, 4, 8, 16, etc.), such as due to an Error Correcting Code (ECC) plane for Holographic Random-Access Memory (HRAM), Double Data Rate 5 (DDR5) memory, and/or Low Power DDR4 (LPDDR4) memory.

As an illustrative example, such as for DDR5 devices, each global column repair may repair 1 of 17 column planes (CPs), which may require five fused CP address bits. Five bits result in 32 decodes even though only 17 decodes are needed. As described in detail below, the apparatus and the match circuit therein may be configured to utilize the remaining CP decodes to represent unused/disabled redundant resources (e.g., redundant columns). Accordingly, the apparatus can implement the repairs with less circuitry components (e.g., enable fuses, fuse latches, and/or XOR logic) per each repair. In comparison to the previous approach, the match circuit may be implemented using one fuse less and one latch less for every column repair segment on die. The match circuit can be implemented using four or less additional logic gates for a group of repairs in comparison to some approaches. However, the reduction in the number of components (e.g., fuses and/or latches) may be greater than the number of additional logic gates, which results in a reduction in the overall number of components in comparison to conventional devices. For example, the match circuit may be implemented using less than 100 additional logic circuits per die in comparison to conventional devices, while reducing the number of required fuses/latches by 2000-2500. Thus, the apparatus described below can provide die size savings while providing necessary features to revert to a disabled state from any blown repair, such as to undo repairs when the redundant resources are or become defective.

Figure 1:
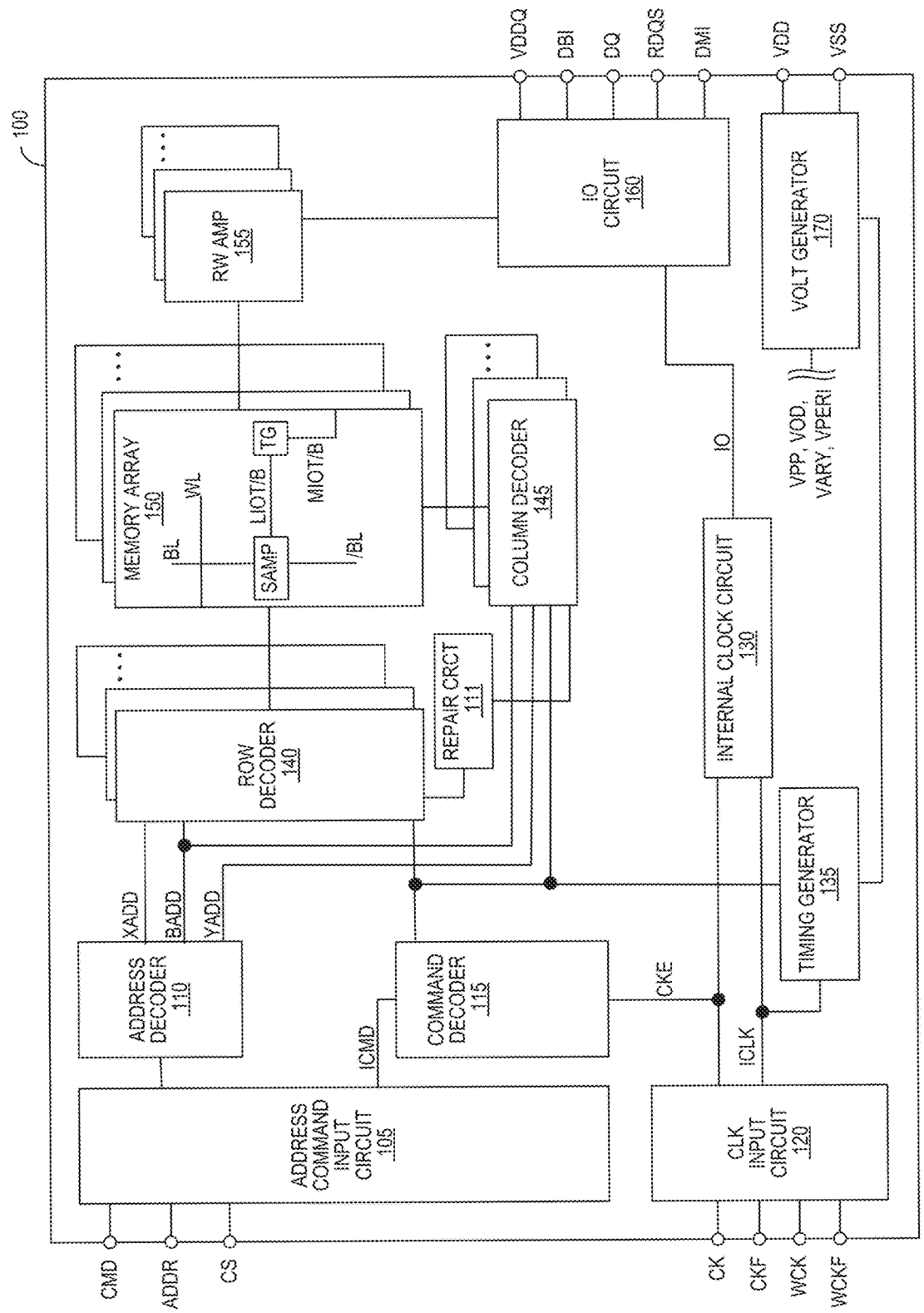
FIG. 1 is a block diagram of an example memory device in accordance with an embodiment of the present technology.

FIG. 1 is a block diagram of an example memory device 100 (e.g., a semiconductor die assembly, including a three-dimensional integration (3DI) device or a die-stacked package) in accordance with an embodiment of the present technology. For example, the memory device 100 can include a DRAM or a portion thereof that includes one or more dies/chips.

The memory device 100 may include an array of memory cells, such as memory array 150. The memory array 150 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals (CMD) and address signals (ADDR), respectively. The memory device 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 1) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller and/or a nefarious chipset. The command signals may represent various memory commands from the memory controller (e.g., including access commands, which can include read commands and write commands). The chip select signal may be used to select the memory device 100 to respond to commands and addresses provided to the command and address terminals. When an active chip select signal is provided to the memory device 100, the commands and addresses can be decoded and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The command decoder 115 may further include one or more registers for tracking various counts or values (e.g., counts of refresh commands received by the memory device 100 or self-refresh operations performed by the memory device 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

Write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register. The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1) from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as timing signals for determining output timing of read data and/or input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100; although in other embodiments, the host device may be indirectly connected to memory device (e.g., over a networked connection or through intermediary devices).

The memory device 100 can include a repair circuit 111, which can be coupled to one or more address decoders, such as the address decoder 110, the row decoder 140, and/or the column decoder 145. The repair circuit 111 can be configured to repair defects in storage cells. For example, the repair circuit 111 can replace defective memory cells with redundant memory cells in the memory array 150. As described in further detail below, the repair circuit 111 can include fuses and local fuse latches configured to store location information (e.g., addresses and/or affected domain identifiers) associated with the defective memory cell. The repair circuit 111 can further include a match circuit configured to implement repairs (e.g., global column repairs). In some embodiments, the repair circuit 111 can utilize an addressing scheme to specify and detect global column repair, enable/disable, and/or other repair conditions. Accordingly, the repair circuit 111 can reduce fuses and/or latches (e.g., fuses/latches associated with enable bits), thereby reducing resources and/or device footprint associated with the repairs, fuses, latches, etc.

Figure 2:
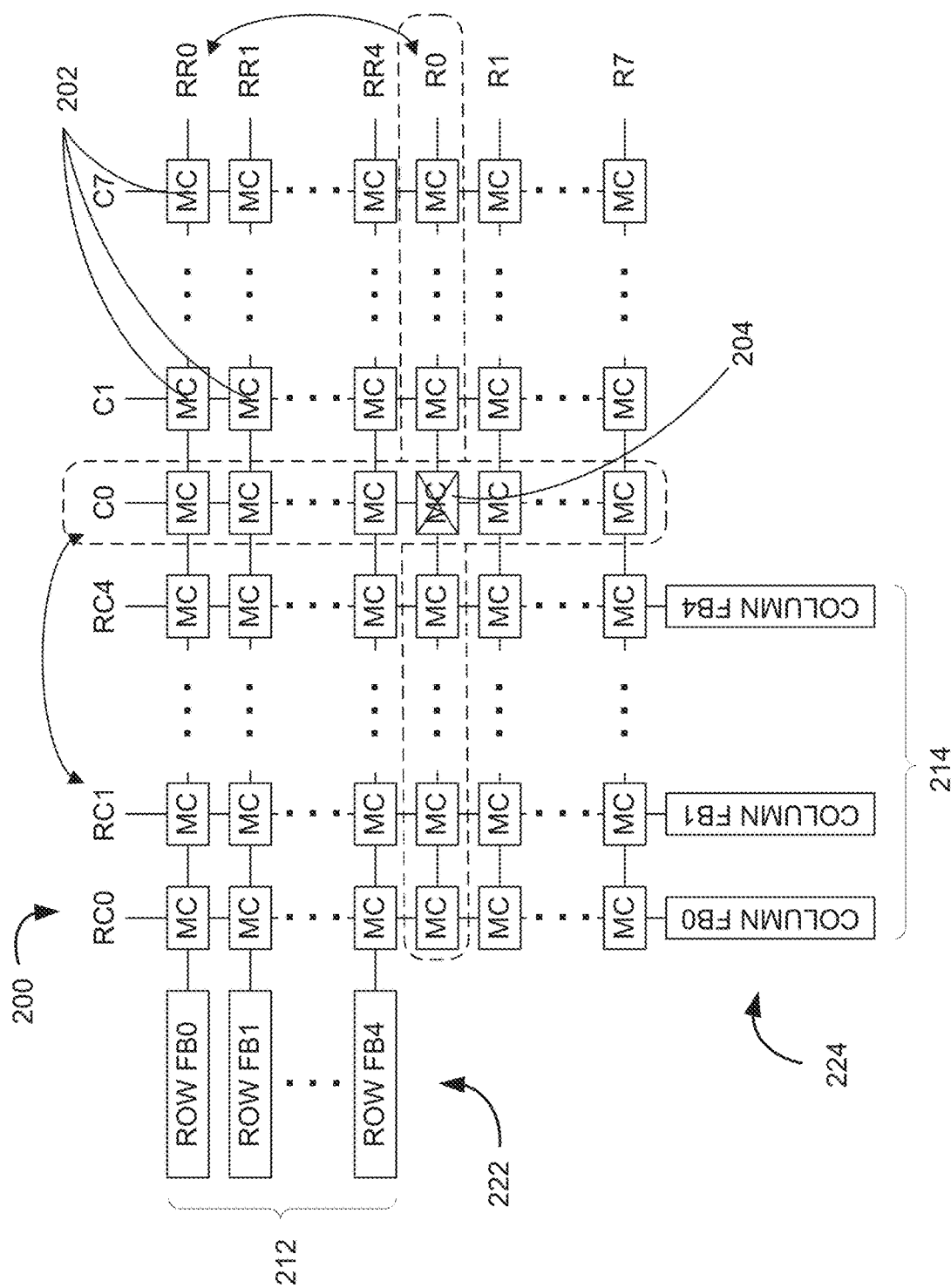
FIG. 2 is a partial block diagram of an example memory device including a set of repairable memory cells.

The memory device 100 can be configured to implement global repairs and/or regional repairs. For illustrating regional repairs, FIG. 2 is a partial block diagram of a memory device 200 including a set of repairable memory cells. The memory device 200 includes a repair circuit coupled to and/or integral with memory cells 202 and configured to repair/replace one or more defective cells 204 within the corresponding set of memory cells 202 (e.g., within a portion of a memory array, such as within the same plane). The memory cells 202 include repair or redundant cells in the same portion of the memory array that are designated to replace the defective cells 204. In other words, the repair cells are configured to be backup memory cells that are not utilized in normal operations unless they are used to replace the defective cells 204. The repair cells may be arranged in rows and columns (e.g., redundant rows 212 and redundant columns 214) similarly to the other memory cells 202 in the same portion.

In replacing the defective cells 204, the memory device 200 may implement repairs for rows, columns, and/or sections therein. For row repairs, the memory device 200 may deploy and utilize the redundant rows 212 to replace rows including the defective cells 204. As illustrated in FIG. 2, the memory device 200 may replace row R0, which contains the defective cell 204 therein, with a redundant row RR0. For column repairs, the memory device 200 may deploy and utilize the redundant columns 214 to replace columns including the defective cells 204. As illustrated in FIG. 2, the memory device 200 may replace column C0, which contains the defective cell 204 therein, with a redundant column RC1.

The repair circuit includes fuse blocks configured to facilitate the memory cell replacements. Each of the blocks include a set of fuse latches that is directly coupled (i.e., with a one-to-one dedicated and fixed electrical and functional connection) to a redundant row or a redundant column. The memory device 200 includes fuses or non-volatile memory (not shown) located in a fuse array on die. The information stored in the fuse array is broadcast at initialization and loaded into the fuse blocks in each bank.

As illustrated in FIG. 2, the fuse blocks include row fuse blocks 222 that are each directly coupled to one of the redundant rows 212 and column fuse blocks 224 that are each directly coupled to one of the redundant columns 214. Each fuse block is configured to store addresses of the row/column including the defective cells 204. For example, when a redundant column is used to replace a defective column, the fuse block for the corresponding redundant column may be programmed (via, e.g., blowing/setting the fuse latches and/or associated fuses) to store the address of the defective column, effectively removing the defective column from operations of the memory device 200. Subsequently, the redundant column is used to store and provide access to data in place of the replaced defective column.

Figure 3A:
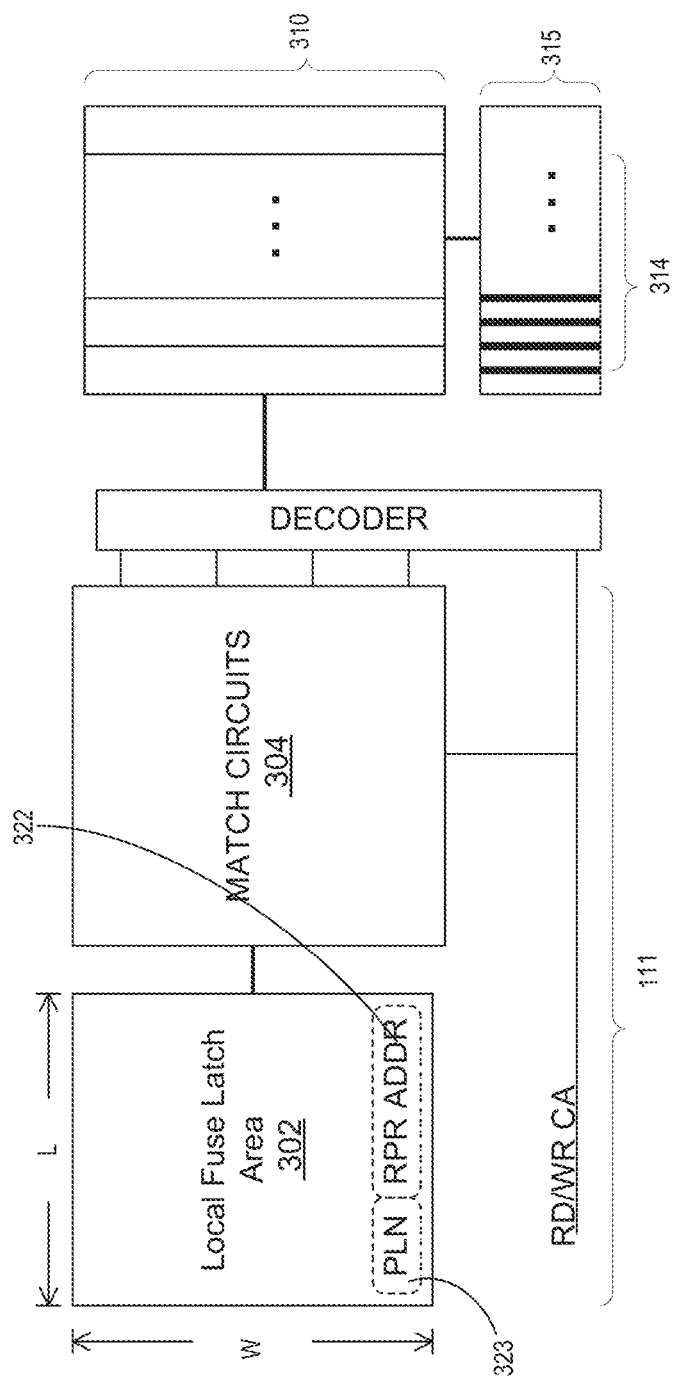
FIG. 3A is a block diagram of a portion of the memory device of FIG. 2 in accordance with an embodiment of the present technology.

FIG. 3A is a block diagram of a portion of the memory device 100 of FIG. 1 in accordance with an embodiment of the present technology. For example, FIG. 3A illustrates the repair circuit 111, a location decoder (e.g., the column decoder 145 of FIG. 1) and/or a portion of the memory array 150 of FIG. 1. In some embodiments, the repair circuit 111 can include a local fuse latch area 302 coupled to match circuits 304. The local fuse latch area 302 can include fuse latches and/or fuses configured to store/latch location information (e.g., addresses) associated with the repair. As described in detail below, the repair circuit 111 can be configured to effectively assign the fuses and/or the latches to repairs for different portions of the memory array 150. The match circuits 304 can include circuitry configured to select the repair location/address that corresponds to the current read/write operation and compare an incoming address (e.g., a read or a write address from a host) to the latched addresses for any matches. In some embodiments, the match circuits 304 can include a selection circuit a comparator circuit for each redundant memory grouping (e.g., for each redundant column or row). Outputs of the match circuits 304 can be used by the location decoder for accessing the targeted location within a memory plane 310 (e.g., a portion of the memory array 150, such as a region within one of the arrays).

The memory array 150 can include the memory cells arranged in one or more planes. Each plane can include memory cells organized in a cross-point architecture such that the memory cells can be arranged in a matrix of rows and columns as described above. The memory device 100 may include a plurality of vertically stacked layers of the memory cells. In other words, layers of the memory cells organized according to the cross-point architecture can be formed at different elevations from one another. The vertically stacked layers can be used to form planes. For example, a column plane can include a set of columns that are arranged along a plane or another structural connection across the different elevations/dimension.

In some embodiments, the memory device 100 can include one or more repair planes 315 (e.g., column planes) that includes redundant memory 314 dedicated to repair defective memory cells (e.g., the defective cells 204 of FIG. 2) in the memory planes 310. In other words, the memory device 100 can include the redundant memory 314 organized into one or more dedicated planes for replacing memory cells in other planes instead of having the memory cells and the repair cells in the same plane. Accordingly, repairs can be global repairs that use repair cells in one plane to replace defective cells in another plane. For example, the memory device 100 can implement a global column repair by storing information to or accessing information from a repair plane instead of a different column plane. The repairs can use the repair planes 315 instead of or in addition to repair elements within each of the planes.

As an illustrative example, information stored in the fuses (e.g., addresses associated with repairs) can be loaded or latched into corresponding latches in the local fuse latch area 302. Accordingly, the local fuse latch area 302 can store repair addresses 322 and plane locators 323. Each of the repair addresses 322 can include an address of the original memory cells, such as a column, that includes one or more defective cells. Each of the plane locators 323 can include an address of a memory plane (e.g., a column plane) that includes one or more defective cells. The memory device 100 can use the match circuits 304 for swapping memory inputs/outputs (MIOs) from the repair planes 315 with the repaired out main array plane (e.g., defective column plane) in the data path.

The match circuit 304 can select one of the repair addresses 322 (corresponding redundant memory on one of the repair planes 315) associated with the memory cells that are active for the current read/write operation. Using column repairs as an illustrative example, the repair addresses 322 can represent memory columns that include one or more defective cells. The match circuits 304 can use the repair addresses to determine when read or write operations target the defective memory columns. The portion of the match circuits 304 can compare a read/write column address (RD/WR CA) to the addresses/locators stored in the latches and generate a flag when the RD/WR CA matches the address of the defective columns represented by the corresponding repair address 322 and the plane locator 323. The decoder can use the outputs of the match circuits 304 to access the redundant columns assigned to replace the defective columns for the read or write instead of the defective columns.

Figure 3B:
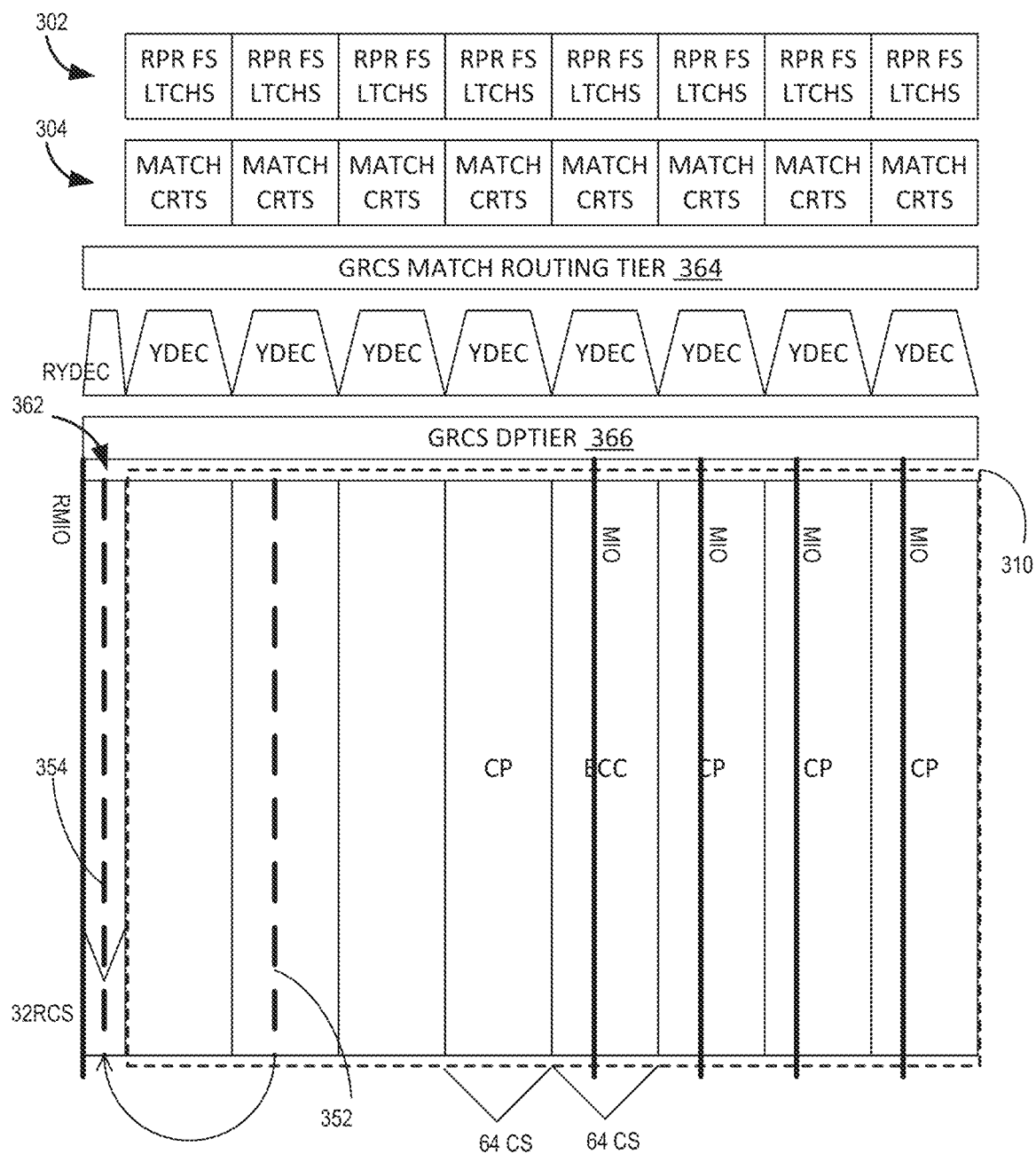
FIG. 3B is a block diagram of a portion of the memory device of FIG. 2 in accordance with an embodiment of the present technology.

As an illustration of the global repairs, FIG. 3B is a block diagram of a portion of the memory device 100 of FIG. 1 in accordance with an embodiment of the present technology. In some embodiments, for example, the memory array 150 can include 16 CPs (e.g., CP0-CP15) and an ECC CP. Global column repairs can be implemented by moving a column repair to a separate redundant plane (e.g., an instance of the repair planes 315 of FIG. 3)

FIG. 3B illustrates an example of repairs for the memory plane 310 using the redundant memory 314 of FIG. 3 and/or the repair planes 315. For global column repair schemes, the columns (e.g., the redundant memory 314) can be located in a separate column plane 362 (e.g., an instance of the repair planes 315) and separate from the main array column plane (e.g., the memory planes 310). In some embodiments (e.g., for DDR4), global column repair scheme can include the redundant column plane 362 as a separate subarray that corresponds to a separate column decoder (RYDEC) and is parallel to the other main array column planes. For the example illustrated in FIG. 3B, a defective column plane 352 or a portion therein (e.g., a column) can be replaced by a separate redundant column plane 354 or a corresponding portion therein. In some embodiments, one such repair may be available per x8 region.

To implement a global column repair, the local fuse latch area 302 and/or the match circuits 304 may indicate the column plane being targeted for repair. Accordingly, additional fuses/latches may be required in the local fuse latch area 302 to identify the targeted column plane. A match routing tier 364 (GRCS MATCH ROUTING TIER) can include circuits that connect the output to the targeted resource (e.g., the redundant column plane). The combination of the decoder and/or a dedicated circuit tier 366 (GRCS DPTIER) can swap the memory inputs/outputs (MIOs) from the repair planes 315 with the repaired out main array plane (e.g., defective column plane) in the data path.

The memory array 150 may also include a plane (e.g., column plane) associated with Error Correcting Code (ECC). Accordingly, the local fuse latch area 302 may include fuses/latches associated with the ECC plane. For example, the memory array 150 can be configured to repair the ECC plane with the redundant memory cells. Accordingly, the local fuse latch area 302 can include a number of fuse/latches corresponding to CP addresses/decodes for accessing the ECC plane in addition to the other repair planes. For example, each global column repair may repair 1 of 17 CPs (e.g., 16 column planes and one ECC plane), which may require five fused CP address bits.

Figure 4A:
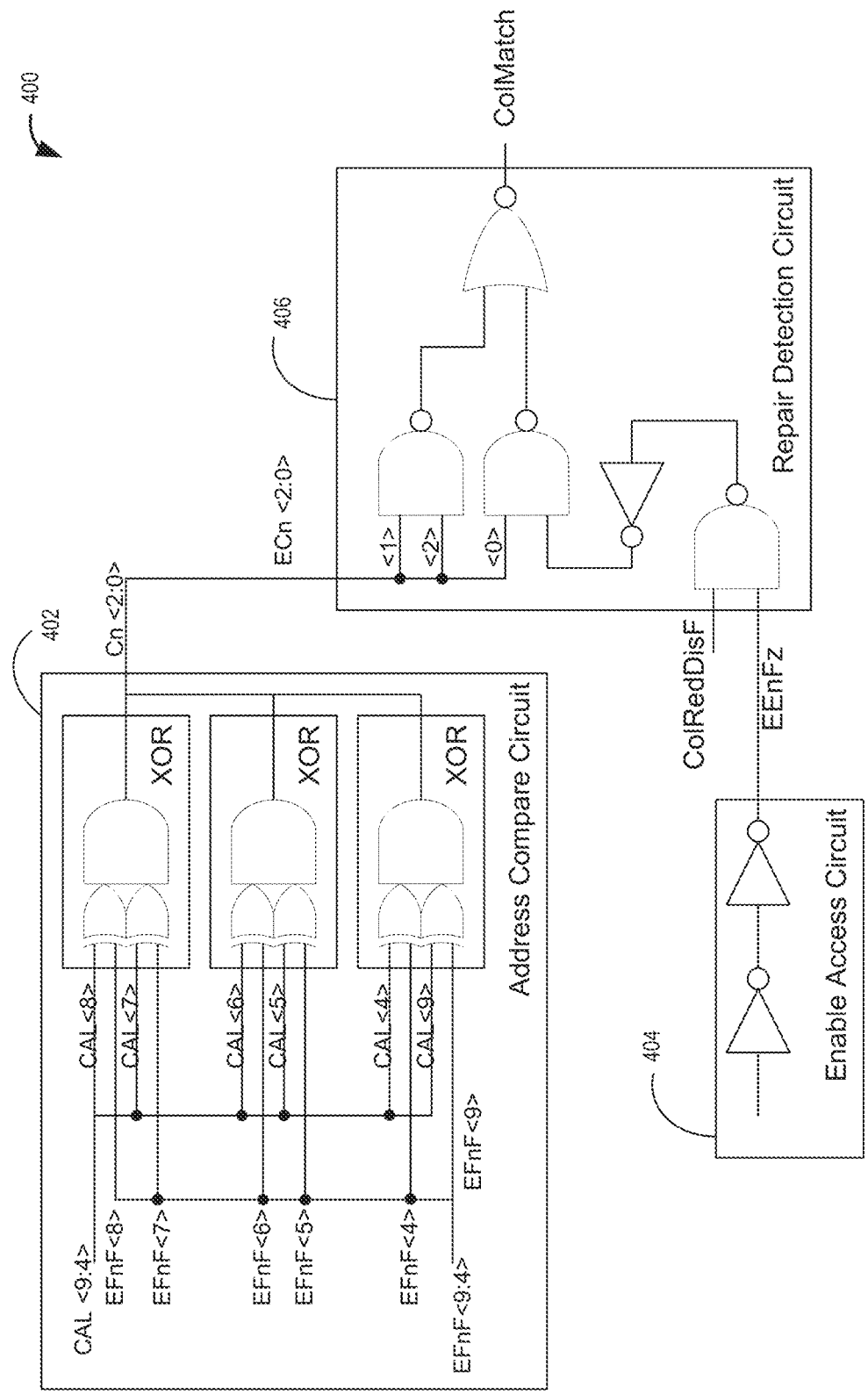
FIG. 4A is a block diagram of a first example match circuit in accordance with an embodiment of the present technology.

FIG. 4A is a block diagram of a first example match circuit 400 (first circuit 400) (e.g., an example instance of the match circuits 304 of FIG. 3A) in accordance with an embodiment of the present technology. The first circuit 400 can be implemented when the local fuse latch area 302 of FIG. 3A includes enable fuses/latches.

FIG. 4B is a first example decode mechanism 450 (first mechanism 450) in accordance with an embodiment of the present technology. The first mechanism 450 can be used with the first circuit 400. The first mechanism 450 can represent the decodes necessary to identify the target column planes. The first mechanism 450 may include the decode values that map to the CP identifiers. For example, decode value '0' with an active enable (e.g., bit value '1') may indicate repair of CP0. Also, decode value '1' with an active enable may indicate repair of CP1. The first mechanism 450 can further include a decode value for repairing an ECC plane.

Referring back to FIG. 4A, the first circuit 400 can be configured to detect the repair status for column planes according to the first mechanism 450. The first circuit 400 can include an address compare circuit 402, an enable access circuit 404, and/or a repair detection circuit 406.

The address compare circuit 402 can be configured to compare a column address (CAL<9:4>) with incoming fuse values (EFnF<9:4>). The address compare circuit 402 can be configured to detect a match between the column address and the incoming fuse values. For example, the address compare circuit 402 can include XOR circuits each configured to receive and compare a unique set of corresponding bits in the column address and the incoming fuse values. The address compare circuit 402 can generate an address comparison result that represents whether the column address matches the incoming fuse values. For example, the address comparison result can include multiple bits (Cn<2:0>) that each represent a bit-wise match status between the column address and the incoming fuse values.

The enable access circuit 404 can be configured to provide the status/value of the enable fuse/latch to the repair detection circuit 406. The enable access circuit 404 can include a buffer for controlling a timing or an output voltage level that represents the value represented by the enable fuse/latch.

The repair detection circuit 406 can be configured to determine whether the address (e.g., the read/write column address) and the enable setting indicate a repair. For example, the repair detection circuit 406 can generate an output (e.g., a column match signal (ColMatch)) that is active when the enable is active and when the column address matches the incoming fuse values. The repair detection circuit 406 can detect the repair condition and generate the active output when the read/write column address matches the value stored in the fuse latch and when the enable is active. In some embodiments, the repair detection circuit 406 can include a set of NAND, NOR, inverter, and/or XOR devices that generate the column match signal according to the enable value and the address comparison result. For example, the repair detection circuit 406 can include the logic devices configured to generate an active value (e.g., '1') when the enable is active and when the address comparison result indicates a match between the column address and the incoming fuse values.

For the global repair, the CP match can be determined via a different circuit (e.g., DPTIER) for the embodiment illustrated in FIG. 4A and FIG. 4B. In other words, the first circuit 400 can be configured to ignore or not analyze the CP address. Accordingly, the memory device 100 can implement the global repair (e.g., the global column repair) based on the CP match and the active output from the repair detection circuit 406. As a result, the memory device 100 can access the redundant memory cells in the one or more repair planes 315 of FIG. 3A instead of the memory cells indicated by the read/write column address based on the active output from the repair detection circuit 406.

As illustrated in FIG. 4B, the first mechanism 450 can include a set of decodes (labeled Undefined in FIG. 4B) that do not match any planes due to the non-binary CP counts. For example, five bits (CP<4:0>) may be used to represent 17 CPs, thereby leaving 15 undefined decodes.

In some embodiments, the memory device 100 of FIG. 1 can use an alternative match circuit and decode mechanism that leverages the undefined decodes for other information. For example, the memory device 100 can use the alternative match circuit and decode mechanism to indicate enable/disable for the repair instead of the dedicated enable fuse/latch. As described in detail below, the plane locators 323 of FIG. 3A can include one or more predetermined bit patterns that represent a repair status (e.g., an unused repair status and/or a disabled repair status). The memory device 100 can further use the alternative match circuit and decode mechanism to indicate a repair for a particular plane using one dedicated decode/address and without merging or combining (via, e.g., XOR) multiple decode values or addresses. Accordingly, the memory device 100 can provide improved/reduced resources and footprint (via, e.g., eliminating the dedicated enable fuse/latch) associated with each die without sacrificing repair flexibility associated with reserved address/decode combinations.

Figure 5A:
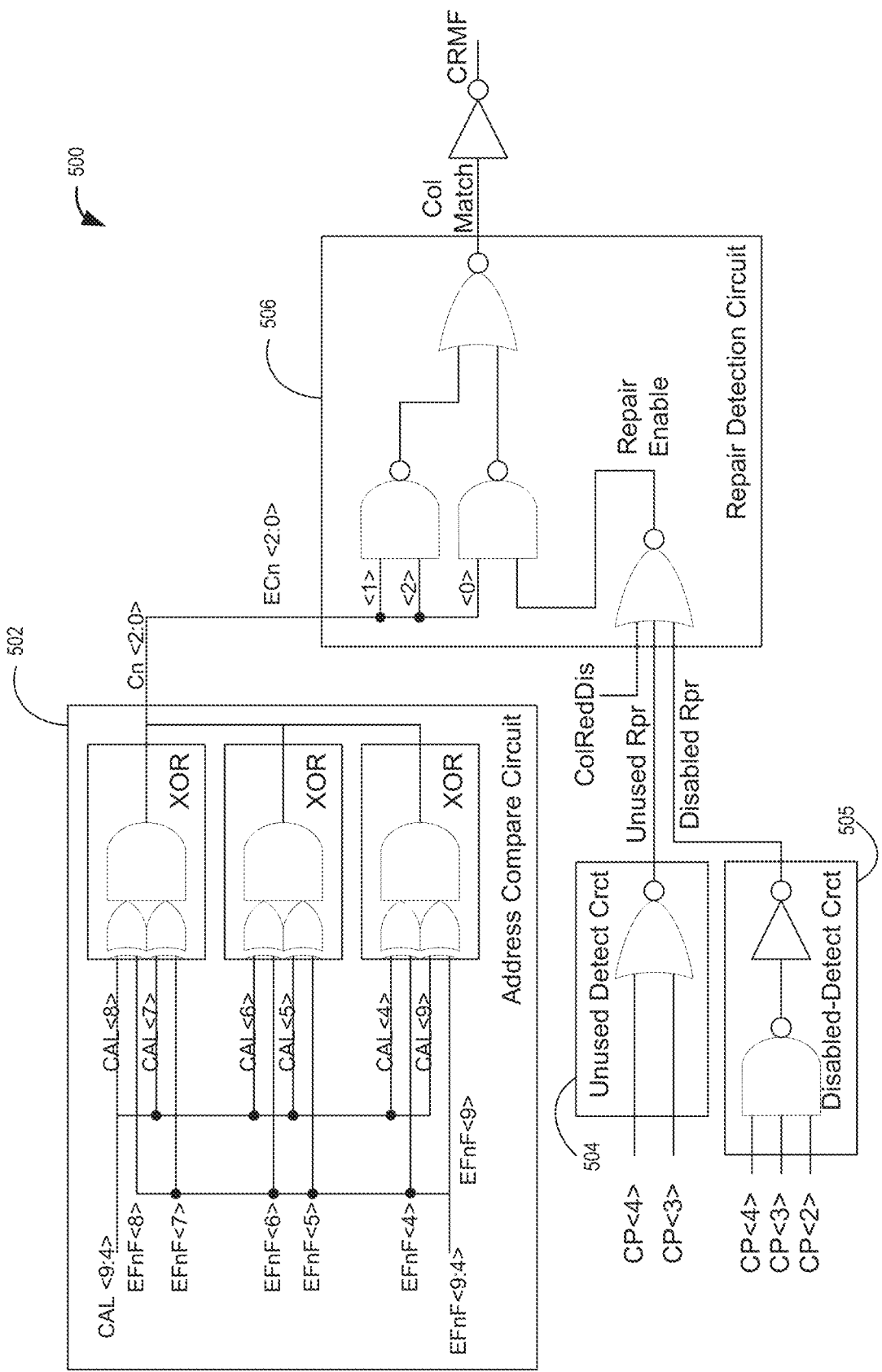
FIG. 5A is a block diagram of a second example match circuit in accordance with an embodiment of the present technology.

For illustrating such schemes, FIG. 5A is a block diagram of a second example match circuit 500 (second circuit 500) (e.g., an example instance of the match circuits 304 of FIG. 3A) in accordance with an embodiment of the present technology. FIG. 5B is a second example decode mechanism 550 (second mechanism 550) in accordance with an embodiment of the present technology. The second circuit 500 can be configured to detect repair status/information according to decode mechanisms that leverage the previously unused decodes, such as the second mechanism 550.

The second mechanism 550 can represent the decodes necessary to identify the target column planes (e.g., values for the plane locators 323 that map to the CP identifiers) without using the dedicated enable bit. The second mechanism 550 can include a pattern for mapping the plane locators 323 to the CP identifiers. For example, the second mechanism 550 can use a sequence/pattern of '0' values to indicate unused repairs and a sequence/pattern of '1' values to indicate disabled repair. Accordingly, the decodes that correspond to column planes can be assigned unique values that exclude the 0-sequence/pattern (e.g., all 0) and exclude the 1-sequence/pattern (e.g., all 1). As an illustrative example, the second mechanism 550 may shift all decodes for the CP fuses in comparison to the first mechanism 450 of FIG. 4B. Also, the second mechanism 550 may reserve decode values for the plane locators 323 including two '0' values to indicate that the column plane is unused. By reserving the '0' values to represent unused repairs and '1' values to indicate disabled states, the second mechanism 550 can preserve paths to get to disabled states. Further, the second mechanism 550 may configured to reduce or minimize the '1' values overall. Moreover, the second mechanism 550 can indicate the unused/disabled status using the bit pattern and without the dedicated enable bit. Accordingly, the second mechanism 550 may be non-incremental. In other words, the decode values may not directly match to the CP identifiers as the first mechanism 450.

Referring back to FIG. 5A, the second circuit 500 can be configured to detect the repair status for column planes according to a decoding scheme that leverages a pattern that indicates disable/enable along with the repair assignments using the decode bits (i.e., without the dedicated enable bit). For example, the second circuit 500 can be configured to detect the repair status for the column planes according to the second mechanism 550. The second circuit 500 can include an address compare circuit 502, a status detection circuit (e.g., an unused detection circuit 504 and/or a disabled-detection circuit 505), and/or a repair detection circuit 506. The second circuit 500 can include the status detection circuit instead of the enable access circuit 404 of FIG. 4A since the second mechanism 550 does not use or include the enable bits. As described in detail below, the unused detection circuit 504 and the disabled-detection circuit 505 can be configured to analyze the plane locator 323 to determine repair status information.

The address compare circuit 502 can be configured to compare a column address (CAL<9:4>) with incoming fuse values (EFnF<9:4>). The address compare circuit 502 can be similar to the address compare circuit 402 of FIG. 4A. For example, the address compare circuit 502 can include XOR circuits configured to detect a match between the column address and the incoming fuse values and generate an address comparison result (Cn<2:0>) accordingly.

The status detection circuit can be configured to generate a repair status based on the plane locator 323. The repair status can represent whether the plane locator 323 indicates when the repair is unused/disabled or otherwise indicates a memory plane subject to the global repair. The repair status can include an unused status flag from the unused detection circuit 504 and/or a disable status flag from the disabled-detection circuit 505.

The unused detection circuit 504 can be configured to determine whether the plane locator 323 indicates an unused repair status. The unused detection circuit 504 can be configured to generate an unused status flag based on the plane locator. For example, the unused detection circuit 504 can be configured to detect a reserved pattern of '0' values (e.g., unused repair pattern) that represent the unused repair status and generate the unused status flag accordingly. As illustrated in FIGS. 4A and 4B, the unused detection circuit 504 can be configured (via, e.g., a NOR device) to detect '0' values for CP<4> and CP<3> bits. The unused detection circuit 504 can activate the unused status flag (via, e.g., generating the unused status flag to have an active value/state, such as logical '1') when the plane locator 323 includes the unused repair pattern.

The disabled-detection circuit 505 can be configured to determine whether the plane locator 323 indicates a disabled repair status. The disabled-detection circuit 505 can be configured to generate a disabled status flag based on the plane locator. For example, the disabled-detection circuit 505 can be configured to detect a reserved pattern of '1' values (e.g., disable repair pattern) that represents the disabled repair status and generate the disabled status flag accordingly.

In some embodiments, the decode mechanism can reserve one or more patterns for a set of bits to indicate a disabled status. The set of bits used to indicate the disabled status can at least partially overlap with bits used to indicate the unused status detected by the unused detection circuit 504. As illustrated in FIGS. 4A and 4B, the disabled-detection circuit 505 can be configured (via, e.g., a NAND device, an AND device, and/or an inverter) to detect '1' values for CP<4>, CP<3>, and CP<2> bits. The disabled-detection circuit 505 can activate the disabled status flag when the plane locator 323 includes the disable repair pattern.

The repair detection circuit 506 can be configured to determine whether the address (e.g., the read/write column address) and the plane locator 323 indicate a repair. The repair detection circuit 406 can receive the outputs from the address compare circuit 502, the unused detection circuit 504, and the disabled-detection circuit 505. The repair detection circuit 506 can be configured to analyze the plane locator 323 and/or a derivation thereof (e.g., the unused repair status). The repair detection circuit 506 can generate a match status (e.g., a column match signal (ColMatch)).

In some embodiments, the repair detection circuit 506 can include a CP analysis circuit (e.g., a NOR gate) configured to receive and evaluate results of the CP address analysis (e.g., outputs from the unused detection circuit 504 and the disabled-detection circuit 505). The CP analysis circuit may further receive and evaluate a system disable (ColRedDis). The CP analysis circuit can be configured to generate a repair enable signal that is active when the output of the unused detection circuit 504 is inactive, when the output of the disabled-detection circuit 505 is inactive, and/or when the system disable is inactive. In other words, the CP analysis circuit can drive the repair enable signal to an active state to indicate that the plane locator 323 indicates a repair location and neither the unused pattern nor the disable pattern.

The repair detection circuit 506 can further include a detection circuit (e.g., NAND, NOR, XOR, or a combination thereof) configured to compare/evaluate the output from the address compare circuit 502 (e.g., the address comparison result) and the enable output from the CP analysis circuit. The detection circuit can generate the match status (e.g., a column match signal (ColMatch)) based on the comparison. For example, the detection circuit can generate the output that indicates (via, e.g., an active state) when the column address matches the incoming fuse value and when the plane locator 323 indicates a plane targeted for repair. In some embodiments, the output of the detection circuit can be negated (via, e.g., an inverter), such as to reduce occurrences of '1' values.

The second circuit 500 can use the output from the detection circuit to indicate whether a column repair is applicable. The CP match can be further determined via a different circuit (e.g., DPTIER) external to the second circuit 500. Accordingly, the memory device 100 can implement the global repair (e.g., the global column repair) based on the CP match and the output from the repair detection circuit 506. As a result, the memory device 100 can access the redundant memory cells in the one or more repair planes 315 of FIG. 3A instead of the memory cells indicated by the read/write column address based on the active output from the repair detection circuit 506.

Figure 6:
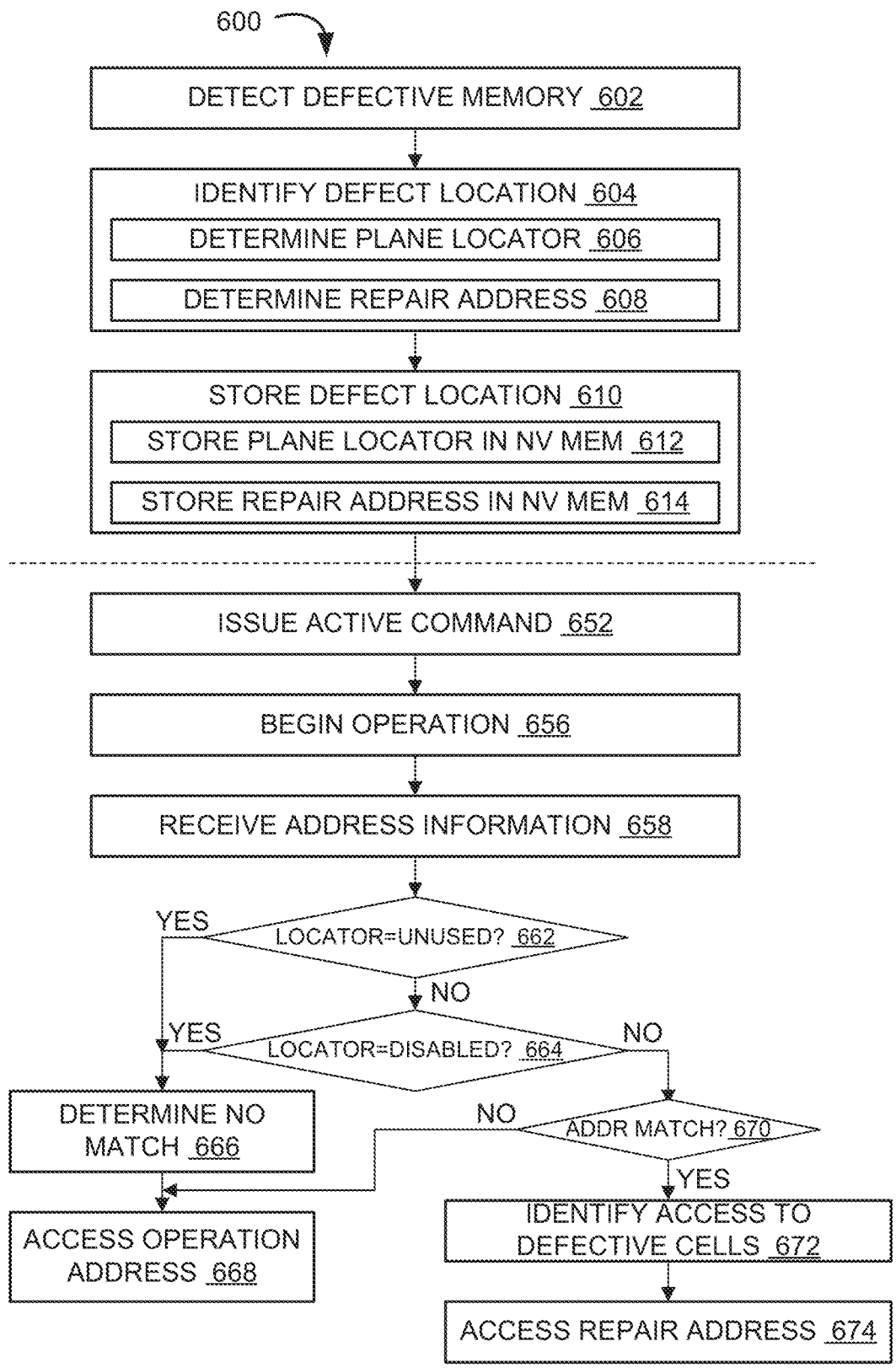
FIG. 6 is a flow diagram illustrating an example method of operating an apparatus in accordance with an embodiment of the present technology.

FIG. 6 is a flow diagram illustrating an example method 600 of operating an apparatus (e.g., the memory device 100 of FIG. 1) in accordance with an embodiment of the present technology. For example, the method 600 can be for operating the local fuse latch area 302 of FIG. 3A, the match circuit 306 of FIG. 3A for replacing one or more defective memory cells with redundant memory cells according to the repair addresses 322 of FIG. 3A and the plane locators 323 of FIG. 3A. The method 600 can effectively or functionally couple (i.e., without or in place of direct one-to-one connections) the fuses and/or the fuse latches used for the repair addresses 322 to the redundant memory in the one or more repair planes 315 of FIG. 3A.

At block 602, the memory device 100 can detect defective memory (e.g., the defective cells 204 of FIG. 2). In some embodiments, the memory device 100 can implement a built-in self-test (BIST), which can be on-line and/or off-line, to test the memory cells (e.g., the memory array 150 of FIG. 1). For example, the memory device 100 can execute a test sequence (via, e.g., a memory controller, a finite state machine, and/or a processor) using a predetermined sequence of test elements that include memory operations, data patterns, and/or addresses. To test, the memory device 100 can write the predetermined data patterns to the corresponding addresses and then read the same addresses to confirm the same data pattern. When the read pattern does not match the predetermined written data pattern, the memory device 100 can identify the memory cells corresponding to the difference as being defective. Accordingly, the memory device 100 can detect the defective memory in the memory planes 310 of FIG. 3A and/or the repair planes 315 of FIG. 3A.

At block 604, the memory device 100 can identify the defect location (e.g., the locations of the defective memory cells). For example, the memory device 100 can identify the internal addresses of the defective memory cells. Using a predetermined table and/or a predetermined process, the memory device 100 can identify an address/identifier for the memory plane 310 and/or the column within the memory array 150 that includes the one or more defective memory cells. Accordingly, the memory device 100 can determine the repair addresses 322 and/or the plane locators 323 that represent the identified location.

At block 606, the memory device 100 can determine a plane locator (e.g., the plane locator 323) that identifies the memory plane 310 having the defective memory therein. The memory device 100 can determine the plane locator that identifies the memory plane 310 (e.g., a column plane) that is swapped out. When the redundant memory (e.g., portions of the repair planes 315) includes defects, the memory device 100 can determine the plane locator 323 as the disabled repair status. At block 608, the memory device 100 can determine a repair address (e.g., the address of a column including the defective memory cells, such as the repair address 422 and/or the repair address 510) for the defective memory cells.

At block 610, the memory device 100 can store the defect locations for repairing the defective memory cells. The memory device 100 can store the defect locations, such as by setting fuses and/or writing to other non-volatile memory. In storing the defect locations, the memory device 100 can store both the repair address 322 and the plane locator 323 for each defective memory cell or each grouping thereof. For example, at block 612, the memory device 100 can store the plane locator 323 in a first set of fuses configured to identify the memory plane 310 that includes the defective cells therein. Also, at block 614, the memory device 100 can store the repair address 322 in a second set of fuses that is paired with the first set of fuses. When the repairs are not necessary, the memory device 100 can store a first data pattern (e.g., a combination of '0' values) predetermined to indicate the unused repair into the corresponding plane locator 323. When the repairs are disabled, such as when the redundant memory is defective, the memory device can store a second data pattern (e.g., a combination of '1' values) predetermined to indicate the disabled repair into the corresponding plane locator 323. Accordingly, the plane locator 323 can include status representations that replace the enable bit used in the first circuit 400 of FIG. 4A and/or the first mechanism 450 of FIG. 4B.

In some embodiments, blocks 602-614 can represent a testing and/or a presetting portion of a manufacturing process. For example, during a manufacturing process, the memory array 150 of FIG. 1 may be provided. The memory array 150 can include the memory planes 310 that each have a plurality of memory cells and include the repair planes 315 that each include a plurality of redundant cells configured to replace a set of defective memory cells in the plurality of memory cells. The manufacturing process can further include providing latches (e.g., the local fuse latch area 302 of FIG. 3A). As described above, the latches can include a set of address latches and a set of locator latches for each repair. The address latches can store the repair address 322 and the locator latches can store the plane locator 323. The testing/presetting portion can be implemented based on testing the memory array 150 as described above. The manufacturing process can also include connecting the match circuit 306 of FIG. 3A to the latches.

The stored location information of the defective memory cells can be used for repairs, such as by accessing/utilizing redundant memory cells in place of the defective memory cells. As an illustrative example, the memory device 100 can load/obtain the stored repair addresses 322 and the stored plane locator 323 into the corresponding latches (e.g., the latches in the local fuse latch area 302) during initialization or power reset. When memory operations reference columns, rows, and/or planes including the defective memory cells, the memory device 100 can use or access the redundant columns, rows, and/or planes associated with the defective memory cells.

At block 652, the memory device 100 can issue an active command (ACT). Based on the active command, the memory device 100 can activate an idle bank, thereby causing a read of that row into the bank's array of column sense amplifiers. In other words, the memory device 100 can issue the active command to open the row.

At block 656, the memory device 100 can begin implementing an operation (e.g., a read or a write operation) in response to a command from a host. At block 658, the memory device 100 can receive an operation address (e.g., a read or a write address) associated with the operation. For example, the memory device 100 can determine the column address (e.g., the read/write column address (CA)) associated with the commanded operation.

At decision block 662, the memory device 100 (e.g., the unused detection circuit 504 of FIG. 5A) can determine whether the plane locator 323 matches the predetermined bit pattern representative of the unused status (e.g., the unused repair pattern). At decision block 664, the memory device 100 (e.g., the disabled-detection circuit 505 of FIG. 5A) can determine whether the plane locator 323 matches the predetermined bit pattern representative of the disabled status (e.g., the disabled repair pattern). Accordingly, the memory device can determine the enable status for the repair address 322 based on the plane locator 323.

When the plane locator 323 indicates the disabled status or the unused status, such as illustrated at block 666, the memory device 100 (e.g., the repair detection circuit 506 of FIG. 5A) can determine a no match scenario for the repair. At block 668, the memory device 100 can access the operation address (e.g., the read/write column address) for the read/write operation. Since the operation address corresponds to non-defective/disabled repaired memory cells as indicated by the comparison, the memory device 100 can implement the global repair scheme accordingly and execute the memory operation utilizing the originally referenced location (i.e., without the repair).

When the plane locator 323 matches neither the unused repair pattern nor the disabled repair pattern, the memory device 100 (e.g., the repair detection circuit 506) can determine that the plane locator 323 indicates an active/enabled state for the repair and/or indicates a targeted memory plane for the repair. In response, the memory device 100 can determine the repair enable status (via, e.g., activating a corresponding flag) based on the plane locator 323.

At decision block 670, the memory device 100 (e.g., the address compare circuit 502 of FIG. 5A) can determine whether the address incoming from the latches (e.g., the repair address 322) matches the operation address (e.g., the read/write column address). In some embodiments, the address compare circuit 502 can generate the address comparison result according to the comparison.

When the incoming address does not match the operation address, the memory cells can access the operation address as described above for block 668. Otherwise, the memory device 100 can identify access to defective/repaired memory cells via the address comparison result and the memory plane (e.g., CP) identified by the plane locator 323.

At block 674, the memory device 100 (e.g., a column decoder) can access the redundant memory (e.g., redundant column) as indicated by the repair address 322. Also, the memory device 100 can multiplex the data path via the DPTIER based on the plane locator 323 to implement the global repair scheme.

Figure 7:
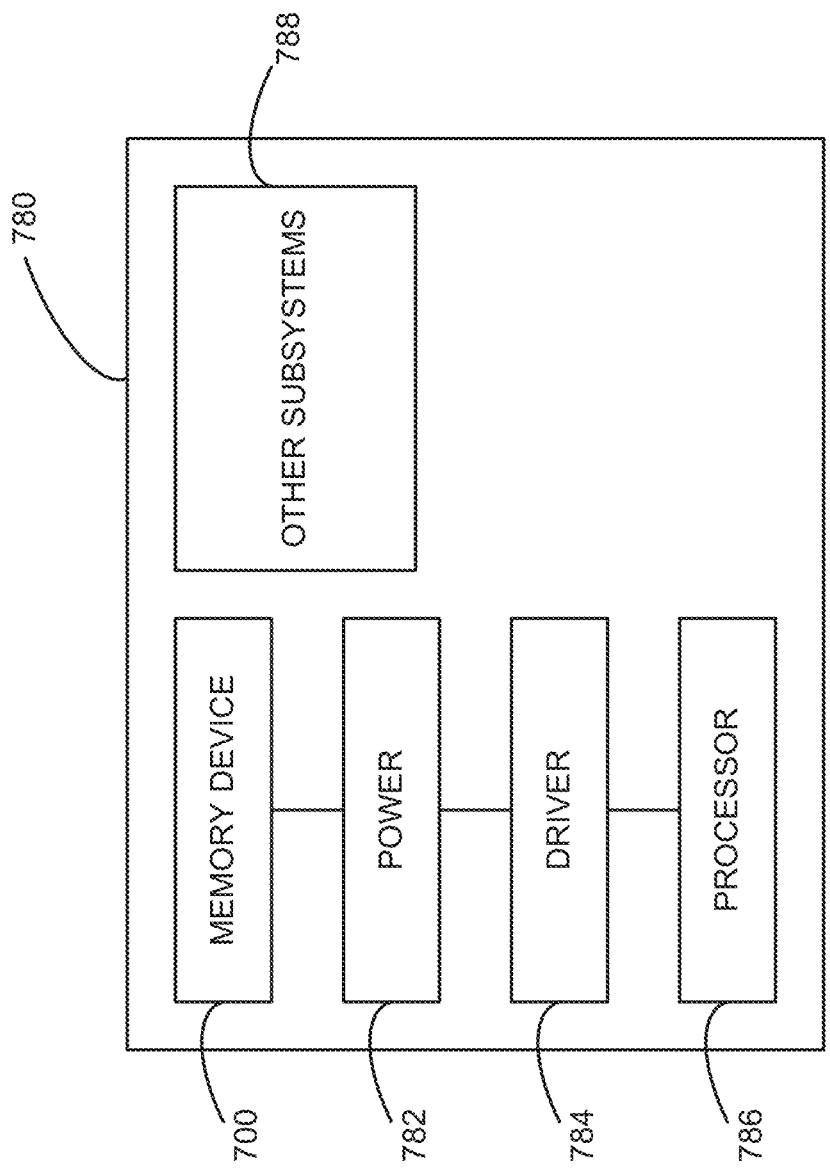
FIG. 7 is a schematic view of a system that includes an apparatus in accordance with an embodiment of the present technology.

FIG. 7 is a schematic view of a system that includes an apparatus in accordance with embodiments of the present technology. Any one of the foregoing apparatuses (e.g., memory devices) described above with reference to FIGS. 1-6 can be incorporated into any of a myriad of larger and/or more complex systems, a representative example of which is system 780 shown schematically in FIG. 7. The system 780 can include a memory device 700, a power source 782, a driver 784, a processor 786, and/or other subsystems or components 788. The memory device 700 can include features generally similar to those of the apparatus described above with reference to FIGS. 1-6, and can therefore include various features for performing a direct read request from a host device. The resulting system 780 can perform any of a wide variety of functions, such as memory storage, data processing, and/or other suitable functions. Accordingly, representative systems 780 can include, without limitation, hand-held devices (e.g., mobile phones, tablets, digital readers, and digital audio players), computers, vehicles, appliances and other products. Components of the system 780 may be housed in a single unit or distributed over multiple, interconnected units (e.g., through a communications network). The components of the system 780 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-7.

The invention claimed is:

1. An apparatus, comprising:
a memory array having a plurality of memory cells arranged according to rows and columns, the memory array including:
a plurality of memory planes corresponding to column planes, and
one or more repair planes, each repair plane having a plurality of redundant cells configured to replace a set of defective memory cells in one of the memory planes;
a set of address latches configured to latch a repair address corresponding to the set of defective memory cells;
a set of locator latches configured to latch a plane locator identifying the one of the memory planes targeted for a global repair; and
a match circuit coupled to the set of address latches and to the set of locator latches, the match circuit configured to—
generate an address comparison result based on comparing the repair address to an address for an operation; and
generate a repair enable flag based on the plane locator, wherein the repair status represents enable, disable, and/or unused setting for the global repair;
wherein the address comparison result and the repair enable flag indicate whether or not to access redundant cells in one of the repair planes instead of memory cells indicated by the address for the operation.

2. The apparatus of claim 1, wherein the repair enable replaces an enable bit associated with the repair address for representing an enable or a disable status of a repair associated with the repair address.

3. The apparatus of claim 1, wherein the match circuit includes:
an address compare circuit coupled to the set of address latches and configured to generate the address comparison result based on comparing the repair address from the set of address latches to the address for the operation;
a status detection circuit coupled to the set of locator latches and configured to generate a repair status based on the plane locator; and
a repair detection circuit coupled to the address compare circuit and the status detection circuit, the repair detection circuit configured to—
generate the repair enable based on the repair status; and
generate a match status based on the address comparison result and the repair enable.

4. The apparatus of claim 3, wherein the status detection circuit includes an unused detection circuit configured to generate an unused status flag based on the plane locator, wherein the unused status flag indicates whether or not the repair address is unused for any repair.

5. The apparatus of claim 4, wherein the unused detection circuit is configured to generate the unused status flag based on detecting a predetermined bit pattern in the plane locator.

6. The apparatus of claim 5, wherein the unused detection circuit is configured to activate the unused status flag when one or more predetermined bits in the plane locator are '0'.

7. The apparatus of claim 6, wherein the unused detection circuit includes a NOR device configured to receive the one or more predetermined bits and generate the unused status flag accordingly.

8. The apparatus of claim 3, wherein the status detection circuit includes a disabled-detection circuit configured to generate a disabled status flag based on the plane locator, wherein the disabled status flag represents whether or not a corresponding set of the redundant cells is disabled for any repair.

9. The apparatus of claim 8, wherein the disabled-detection circuit is configured to generate the disabled status flag based on detecting a predetermined bit pattern in the plane locator.

10. The apparatus of claim 9, wherein the disabled-detection circuit is configured to generate the disabled status flag when one or more predetermined bits in the plane locator are '1'.

11. The apparatus of claim 10, wherein the disabled-detection circuit includes an AND device or a NAND device configured to receive the one or more predetermined bits and generate the disabled status flag accordingly.

12. The apparatus of claim 3, wherein the status detection circuit is configured to:
    detect an unused status based on a first set of bits in the plane locator; and
    detect a disabled status based on a second set of bits in the plane locator, wherein the second set of bits at least partially overlap with the first set of bits.

13. The apparatus of claim 1, wherein the plane locator corresponds to a decode mechanism that reserves one or more sets of bit patterns to indicate a repair status and other bit patterns to indicate planes targeted for repair, wherein the other bit patterns exclude the reserved bit patterns.

14. The apparatus of claim 13, wherein the plane locator corresponds to the decode mechanism that reserves a combination of '0' values to represent unused repairs and a combination of '1' values to represent disabled repairs.

15. The apparatus of claim 13, wherein the other bit patterns of the plane locator represent the column planes for globally replacing the set of defective memory cells comprising a column in one of the memory planes.

16. The apparatus of claim 1, wherein the memory device comprises a random-access memory (RAM) device.

17. The apparatus of claim 16, wherein the RAM comprises a Holographic RAM (HRAM), a Double Data Rate 5 (DDR5) RAM, or a Low Power DDR4 RAM.

18. The apparatus of claim 1, wherein the memory device includes the memory array having a quantity of the memory planes, wherein the quantity is not equal to a power of two.

19. The apparatus of claim 18, wherein the memory device includes 16 planes and one Error Correction Code (ECC) plane.

20. The apparatus of claim 1, wherein the match circuit is configured to generate the repair enable flag directly based on the plane locator and without combining addresses.

21. A method of operating a memory device that includes a plurality of memory cells arranged according to rows and columns and a plurality of redundant cells configured to replace one or more defective memory cells in the plurality of memory cells, the method comprising:
    obtaining a repair address representing a location of the one or more defective memory cells;
    obtaining a plane locator representing a column plane within the memory array that includes the one or more defective memory cells, wherein the plurality of memory cells are grouped into column planes and the redundant cells are grouped into one or more repair planes;
    determining an enable status for the repair address based on the plane locator, wherein determining the enable status includes activating a repair enable flag when one or more predetermined bits of the plane locator do not indicate an unused status nor a disabled status; and
    implementing a global repair according to the enable status, wherein implementing the global repair includes globally replacing the one or more defective memory cells when the repair enable flag is activated.

22. The method of claim 21, wherein implementing the global repair includes globally replacing the one or more defective memory cells with a column in a repair plane according to the repair address and the plane locator when the enable status is active, wherein the one or more defective memory cells are included in to a column indicated by the repair address and located on a plane indicated by the plane locator.

23. A method of manufacturing a memory device, the method comprising:
    providing a memory array having a plurality of memory cells arranged in rows and columns, the memory array including (1) memory planes corresponding to column planes and (2) one or more repair planes that each include a plurality of redundant cells configured to replace a set of defective memory cells in the plurality of memory cells;
    providing latches including a set of address latches and a set of locator latches for each repair, wherein—
        the set of address latches are configured to store a repair address representing a location of the set of defective memory cells within the segment,
        the set of locator latches configured to store a plane locator representing a plane targeted for a global replace; and
    connect a match circuit to the latches, wherein the match circuit is configured to—
        determine whether the repair address matches an address for an operation, and
        generate a repair enable flag based on the plane locator, wherein the repair status represents enable, disable, and/or unused setting for the global replace.

* * * * *